(12) United States Patent
Arnold et al.

(10) Patent No.: US 6,378,065 B1
(45) Date of Patent: Apr. 23, 2002

(54) APPARATUS WITH CONTEXT SWITCHING CAPABILITY

(75) Inventors: Roger D. Arnold, Sunnyvale, CA (US); Alfred Eder, Friedberg (DE)

(73) Assignee: Infineon Technologies North America Corp., Iselin, NJ (US)

( * ) Notice: Subject to any disclaimer, the term of this patent is extended or adjusted under 35 U.S.C. 154(b) by 0 days.

(21) Appl. No.: 09/069,030

(22) Filed: Apr. 27, 1998

(51) Int. Cl.[7] .................................................. G06F 9/00
(52) U.S. Cl. ........................ 712/228; 712/229; 711/157
(58) Field of Search ................. 711/127, 157; 712/228, 229

(56) References Cited

U.S. PATENT DOCUMENTS

| | | | |
|---|---|---|---|
| 4,410,939 A | * 10/1983 | Kawakami | .................. 364/200 |
| 4,434,461 A | 2/1984 | Puhl | |
| 4,694,433 A | 9/1987 | Wiedmann | |
| 5,021,993 A | * 6/1991 | Matoba et al. | ............... 712/228 |
| 5,590,122 A | * 12/1996 | Sandorfi et al. | ............ 370/394 |
| 5,680,641 A | * 10/1997 | Sidman | ........................ 710/20 |
| 5,768,530 A | * 6/1998 | Sandorfi | ..................... 709/233 |
| 5,778,243 A | * 7/1998 | Aippetspach et al. | .. 395/800.11 |

FOREIGN PATENT DOCUMENTS

GB 2216307 * 4/1989 ........... G06F/12/06

* cited by examiner

Primary Examiner—Matthew M. Kim
Assistant Examiner—Pierre M. Vital
(74) Attorney, Agent, or Firm—Fish & Richardson P.C.

(57) ABSTRACT

The present invention relates to a data processing unit, comprising at least one register having at least one read port and one write port. The register has at least two memory cells each having a write line and a read line, a first switch having inputs and one output for coupling said read line of one of said memory cells with said read port, second switch for coupling said write line of one of said memory cells with said write port.

38 Claims, 4 Drawing Sheets

APPARATUS WITH CONTEXT SWITCHING CAPABILITY

BACKGROUND OF THE INVENTION

The present invention relates to an apparatus with context switching capability. Most embedded and real time control systems are designed according to a model in which interrupt handlers and software managed tasks are each considered to be executing on their own virtual microcontroller. That model is generally supported by the services of a real time executive or operating system, layered on top of the features and capabilities of the underlying machine architecture. A virtual microcontroller can be seen as a task having its own general purpose registers and associated special function registers like program counter, program status word, etc., which represent the task's context. Handling of these virtual microcontrollers in most of the known systems is done by means of software which saves and restores the respective context. Therefore, software for such a data processing unit needs an increased amount of memory and execution overhead for the context switching operation reduces the processing bandwidth available to application tasks.

In general a context switch requires that the content of at least certain registers of a register file are stored in a predefined memory area and are replaced with the content of another memory area. Each memory area thereby represents a specific context which contains all necessary data related to a specific task or interrupt service routine. This operation, also called context switching, is a critical time consuming part within a so called real time operating system software. Such an operating system often has the object to react as quickly as possible on external or internal events.

SUMMARY OF THE INVENTION

It is an object of the present invention to provide a method and a data processing unit with the capability of fast hardware-assisted context switching, resulting in accelerated execution of context switching operations. This object is achieved by a data processing unit, comprising at least one register having at least one read port and one write port. The register has at least two memory cells each having a write line and a read line, a first switch comprises inputs and one output for coupling said read line of one of said memory cells with said read port, a second switch for coupling said write line of one of said memory cells with said write port is provided.

Another object of the present invention is to provide a method for fast context switching operations. This object is achieved by using at least one register comprising at least two memory cells, and a switch for read/write access of one of the memory cells in a data processing unit executing instructions stored in a memory unit. The method comprises the steps of: selecting a first memory cell in said register, upon execution of a first predetermined event, such as a instruction or exception, switching from said first memory cell in said register to another memory cell in said register, upon execution of a second predetermined event, switching back to said first memory cell.

A context switch occurs either by any call- or return-instruction, execution of an interrupt or trap or similar events. A context can consist of the content of a set of registers. A context can be divided into several parts, for example, into two parts, an upper and a lower context. In such a case it is in most cases only necessary to save one part forming the basic context. But, certain more complex routines might need to save more than a basic context. For these instances, special instructions provide the ability to save/restore the other parts of a context. Throughout the application context can mean both, the basic part of a context or the complete context.

Basically, the present invention provides a mechanism of automatically saving and restoring such a context which under most favorable conditions does not need any transfers of register contents from or to the memory. Each register which stores part of a context contains two or more memory cells. Instead of saving and restoring the content of each register the present invention provides a switching unit which switches between the different memory cells in each register in an appropriate way. In other words, each context is assigned to a different memory cell in the respective registers.

A less hardware intensive embodiment saves and restores only a fraction of registers which are assigned to a context, thus cutting down the number of execution cycles involved with each call- or return-instruction.

A register file having dual-bit registers according to the present invention has the advantage of allowing calls and returns to issue in parallel with integer pipeline operations. The invention can be applied to all kinds of microprocessors or microcontrollers. For example, microprocessors using a stack for call/returns or linked lists benefit from the present invention. Statistically, most calls return without further calls to another subroutine. In these cases a call or a return instruction only needs a minimum amount of cycles compared to a plurality of cycles which is needed to save all necessary registers in the prior art.

Further to the above portions of this section, which summarize embodiments of the present invention, the remainder of this section summarizes other embodiments, but not all embodiments.

According to one embodiment of the present invention, there is a method of context switching from a first task to a second task in a data processing unit having a memory and a plurality of registers coupled with the memory with a set of registers representing a context. Each of the registers has at least two memory cells and a selector to switch between the memory cells. The method includes: upon execution of a first predetermined event the step of speculatively storing a less than full portion of a current context from the set of registers to the memory and then switching to the next available memory cell in each of the registers, and upon execution of a second predetermined event the step of switching back to the previous memory cell in each of the registers.

According to another embodiment of the present invention, there is a method of context switching from a first task to a second task in a data processing unit having a memory and registers coupled with the memory with a set of registers representing a context, each of the registers having at least two memory cells, each memory cell having at least one read port and one write port and a switch to select one of the read ports and a switch for random access of the write ports. The method comprises: upon execution of a first predetermined event the step of speculatively loading at least a portion of a context into the plurality of registers from the memory and then switching to the read ports of the next available memory cell in each of the registers, and upon execution of a second predetermined event the step of switching back to the read ports of the previous memory cell in each of the registers.

According to another embodiment of the present invention, there is a method of context switching from a first task to a second task in a data processing unit having a memory and registers coupled with the memory with a set of registers representing a context, each of the registers having at least two memory cells, each memory cell having at least one read port and one write port and a switch to select one of the read ports and a switch for random access of the write ports. The method includes: upon execution of a first predetermined event the step of switching to the read ports of the next available memory cell in each of the registers, upon execution of a second predetermined event the step of switching back to the read ports of the previous memory cell in each of the registers, and upon execution of the first predetermined event and before switching to the read port of another memory cell the step of storing the content of the current memory cells of a predefined number of registers of the set of registers in the memory.

According to another embodiment of the present invention, there is a data processing unit that includes: at least one register having at least one read port and one write port, the register having at least two memory cells each having a write line and a read line, a first switch comprising inputs and one output for coupling the read line of one of the memory cells with the read port, a second switch having at least one input and outputs for coupling the write line of one of the memory cells with the write port, and a control unit configured to operate at least the first and second switches to, in response to a call instruction, speculatively initiate saving of content of current memory cells and select a next one of the at least two memory cells as the new current memory cell, wherein the new current memory cell is made available for use only after some content of the previous memory cells has been speculatively saved, and to, in response to a return event, select the previous memory cell as once again the current memory cell.

According to another embodiment of the present invention, there is a data processing unit that includes: a register file having a first set of registers and a second set of registers, the registers in the first set of registers having at least one read port and one write port and the registers each having n memory cells each having a write line and a read line, wherein n is at least two, a first switch for coupling a read line of one of the memory cells of each register of the first register set with a respective read port, and a second switch for coupling a write line of one of the memory cells of each register of the first register set with a respective write port, a memory, a bus that couples the first set of registers with the memory, wherein the bus is configured to transfer a context from the first set of registers to the memory in p cycles, and a control unit that controls the switches to conduct context switching, including speculatively saving contexts to memory that may not ultimately need to be saved to memory so that even if n calls are executed without intervening returns, the calls are guaranteed to take less than p cycles each.

DESCRIPTION OF THE PREFERRED EMBODIMENT

Figure 1:
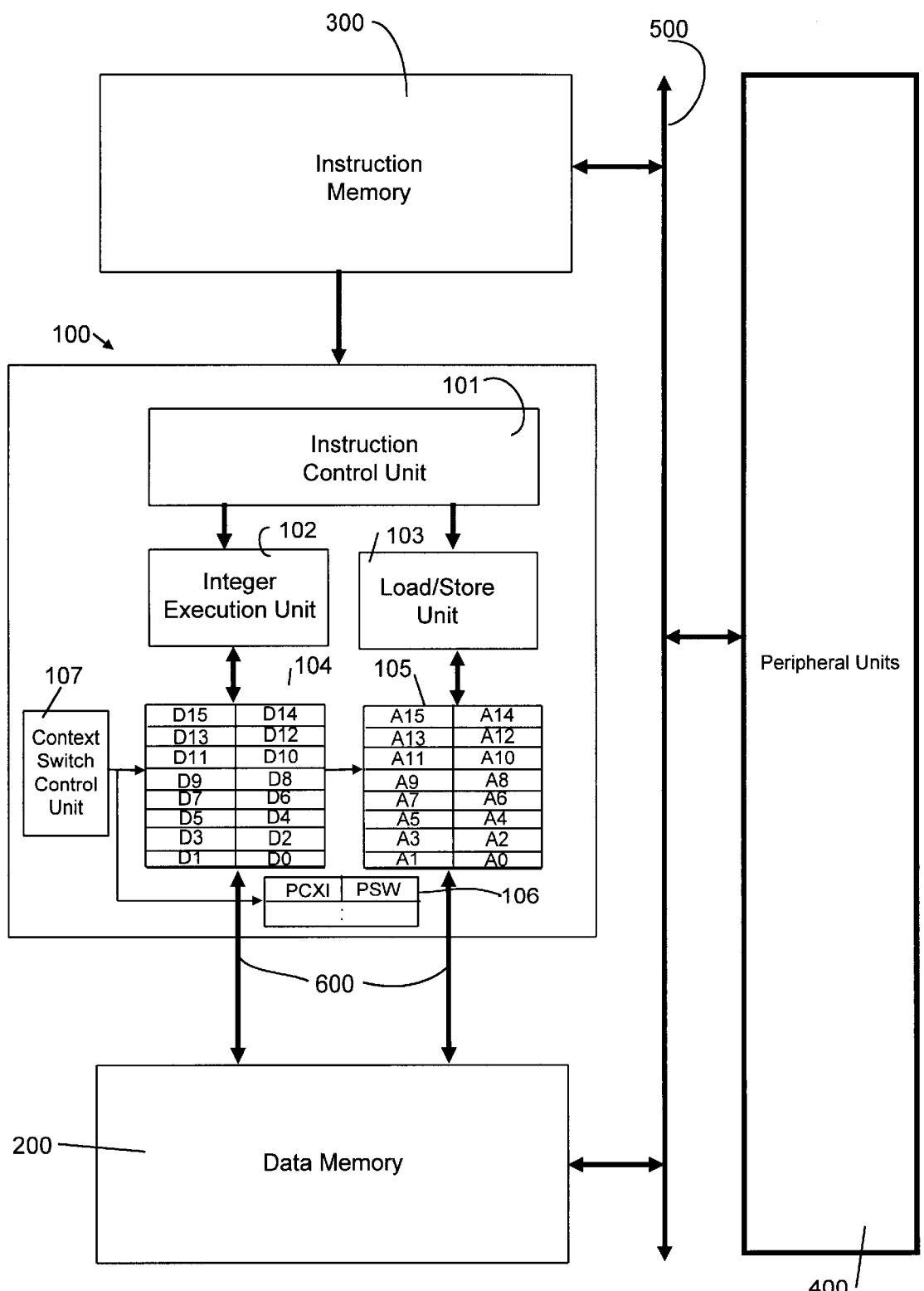
FIG. 1 shows a block diagram representing the register file of a microprocessor according to the present invention.

FIG. 1 shows a block diagram of, for example, a 32-bit microprocessor or a 32-bit microcontroller using the linked list mechanism for executing context switching instructions. A central processing unit (CPU) 100 comprises an instruction control unit 101 which is coupled with a instruction memory 300. The instruction control unit feds in this embodiment two pipelines, an integer execution unit 102 and a load/store unit 103. The integer execution unit 102 is generally coupled with a data register file 104 and the load/store unit 103 is generally coupled with an address register file 105. The register files 104 and 105 are each arranged in eight even and 8 odd registers defining 32 general purpose registers. Each register allows multiport access. Especially the arrangement in even and odd registers allows parallel access to two registers in each register file. Although, both pipelines can access data and address registers, the access paths are not shown in FIG. 1 for the benefit of a better overview. A context control unit 107 controls access to the different memory cells in the respective registers of both register files 104 and 105. Multiple system registers 106 control various functions in the CPU 100. Two registers PSW and PCXI of the system registers 106 in this embodiment are relevant for a linked list context switching and are preferably dual-bit registers according to the invention as their content is part of a context in this embodiment. A context switch control unit 107 controls, for example, by means of a state machine, the different registers of the three register files 104, 105, and 106 which are described in more detail below. A data memory 200, for example a cache memory, is coupled with the data and address register files 104 and 105. A peripheral bus 500 is provided to couple any peripheral units 400 with the instruction and data memory 300 and 200 and the CPU 100.

In many microprocessors the context, which can be defined by the content of one to all registers, must be stored through individual instructions. According to the present invention this process is highly automated. Saving/storing and loading/restoring is done automatically upon a respective first and second event. This event can be either an instruction or an exception or trap or a similar event. A context can consist of a number of registers of the register file, for example, registers D8, . . . D15, and A8, . . . A15. Throughout the description a so called linked list is used to save a plurality of different contexts. Nevertheless, the basic principle of automatically storing/restoring of a context can be easily adapted to any other mechanism, for example the well known stack-mechanism. In the described embodiments, storing/restoring of a context means storing/restoring registers D8, D9, . . . D15 of the data register file, A10, A11, . . . A15 of the address register file and the PCXI- and the PSW register of the system registers. These 16 registers form the upper context. Some routines might need to store/restore in addition the other 16 registers D0, . . . D7, and A0, . . . A7 of the data and address register file which form the lower context. Special instructions are provided to accomplish this. Nevertheless, to speed up this operation in the same way, these registers can be of the same type according to the invention and the same store/restore mechanism can apply which will be described in more detail below.

All registers according to FIG. 2, FIG. 4, FIG. 6, and FIG. 8 show only one single bit for the benefit of a better overview. Of course, the size of a register can be any number of bits. In the following examples 32-bit registers are described.

Figure 2:
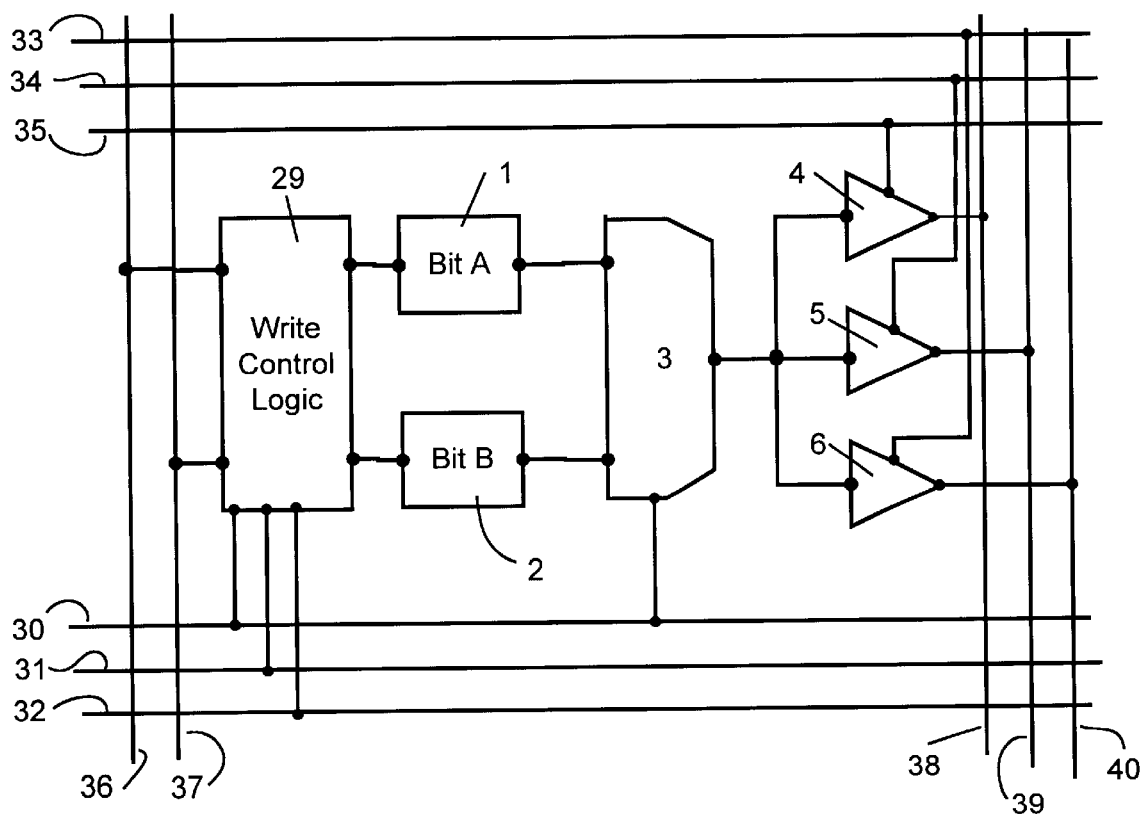
FIG. 2 shows a block diagram representing a single register cell in a register file according to the present invention.

The single register shown in FIG. 2 represents the registers in data register file 104 and in address register file 105 and the two system registers PSW, and PCXI which are used in this embodiment to store a context of a task. For example, data register file 104 and address register file 105 may each contain sixteen 32 bit wide registers, the upper eight registers of the data register file 104 and the upper 6 registers of the address register file 105 as well as two system registers which are used to store the content of a task context. The lower 8 registers can be used as additional context registers, if necessary. The remaining to address registers A8 and A9 are used as global pointers. Therefore, in this embodiment, at least the upper eight registers of the data register file and the upper 6 registers of the address register file as well as the PCIX- and the PSW-register of the system registers 106 are registers according to FIG. 1 and the other 10 registers in each register file may be registers according to the prior art. Of course, all registers in the register files can be dual bit registers according to the present invention. Some of the system registers responsible for context switching may also be formed as dual-bit registers according to the present invention. This depends on how the respective system handles context switching. One mechanism of storing and loading a context, the so called linked list mechanism, is disclosed in U.S. patent application Ser. No. 08/92852 "Data processing unit with hardware assisted context switching capability" which is hereby incorporated by reference.

FIG. 2 shows a single multi-port register cell in, for example, a register file of a microprocessor or microcontroller as shown in FIG. 1. The single register contains two memory cells 1 and 2 for storing a first Bit A and a second Bit B. Both memory cells 1 and 2 comprise read and write ports. The read ports are coupled with a switch 3 which is controlled by a control line 30. The switch 3 comprises an output which is connected to the inputs of three controllable drivers 4, 5 and 6. The outputs of the drivers 4, 5 and 6 are connected to read port data lines 38, 39 and 40 respectively. The control inputs of drivers 4, 5 and 6 are connected to read port word lines 33, 34 and 35 respectively. The write ports of memory cells 1 and 2 are coupled with a write control logic 29. This write control logic 29 is also coupled with two write port data lines 36 and 37. Control inputs of write control logic 29 are coupled with control line 30 and write port word lines 31 and 32. The write control logic 29 and the switch 3 are coupling one of both memory cells 1 or 2 with the respective read or write port data lines. Thus, making one of the memory cells 1 or 2 the current memory cell and the other the alternate cell.

The design according to FIG. 2 can be fully static, therefore, no precharged bit lines or sense amplifiers are necessary. On the read ports of the memory cells 1 and 2, a multiplexer 3 passes one of the two stored bit values to tri-state drivers 4,5 and 6 on the port lines. The multiplexor 3 is controlled by a single global bit select line 30. The same line is also input to the write control logic 29, and selects which of the memory cells 1 or 2 is accessed by the write ports. In this embodiment overall, only one cell at a time is "active", and accessible through any of the ports.

A dual-bit register according to FIG. 2 can be used in different ways which will be explained in more detail below.

Figure 3:
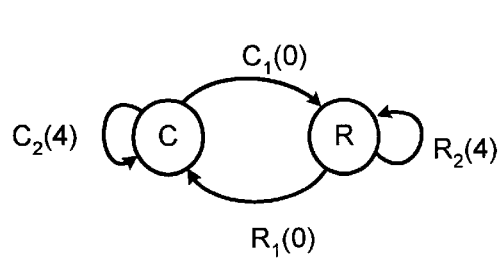
FIG. 3 shows a two state model diagram for a dual bit register cell according to the invention.

A first two-state model is shown in FIG. 3. The letter C stands for a call or context save and the letter R for a return or context restore. Context control unit 107 contains this state machine to control the operation of the switching units 29 and 3 to access the two different memory cells 1 and 2 in each register.

If the last operation was a call or context save indicated by letter C, then the alternate memory cell 2 holds a prior context that has not yet been saved to memory. If the next operation is a return or context restore, the restore can be affected simply by switching back to the alternate set memory cells. This is indicated by the transition $R_1(0)$. No cycles of memory to register data transfer are required. This is also indicated by the 0 in parenthesis after the $R_1$ transition. On the other hand, if the next operation is a call, however, the unsaved prior context in the regular or alternate memory cell 1 or 2 depending on which one is the current used memory cell must be written through transition $C_2(4)$ to the memory 200 before this set can become the new memory cell of a register for the called function. If the bus 600 is, for example, 128 bits wide, then 4 registers could be saved in the memory in parallel. Thus, 4 cycles are needed to save a context consisting of eight 32-bit wide data registers and eight 32-bit wide address registers in this case as indicated by the 4 in parenthesis after the $C_2$ transition.

If the last operation was a return or context restore indicated by letter R in FIG. 3, then the alternate memory cell holds dead values from a context that has exited. In this case, if the following operation is a call, the context save can be effected simply by toggling the bit selection through control line 30, leaving the "saved" context resident in the alternate memory cell as indicated by transition $C_1(0)$. No cycles of register to memory data transfer are required. On the other hand, if the next operation is another return, the restored context must be brought in from the memory 200 by transition $R_2(4)$. Reading the context again takes four cycles with a 128-bits wide bus.

This two-state embodiment works well, when calls alternate with returns with a high degree of probability. However, different applications and the respective programs might have more calls in a row building up deeper stacked routines.

Figure 5:
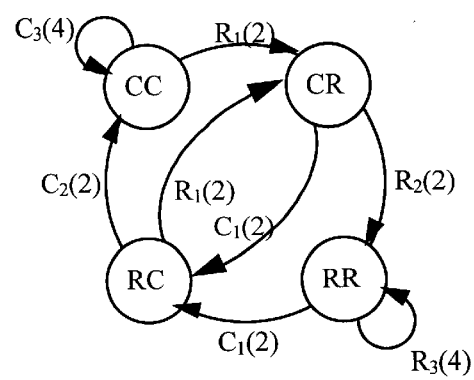
FIG. 5 shows a four state model diagram for a dual bit register cell according to the invention.

Therefore, in FIG. 5 a four-state machine for controlling the context switching is depicted. This four-state machine is more advanced and thus, reduces the percentage of four-cycle calls and returns substantially. It does so by speculatively saving or restoring, for example, half of the context in the alternate memory cells even under circumstances where the two-state model would require no save or restore cycles. So, for example, on a call where the current context could be "saved" in the alternate memory cell simply by toggling control line 30, it speculatively writes half of the context to memory before performing the toggle. Then, if the next operation should turn out to be another call, it has already saved half of the context in the alternate memory cell.

A similar strategy is used for returns. On a return where the full return context is held in the alternate memory cell, i. e., one that follows a call, the switch to the alternate memory cell is not performed immediately. Instead, half of the next return context is speculatively read into the current bit set, before toggling to the alternate set. Then, if the next operation should be another return, half of the new return context has already been read from the memory 200, and only two cycles are needed to complete the full context restore.

This four-state model "levels out" the context save/restore activity, making better use of the cycles that are available during the call and return branches. To achieve best results the state model for the context control unit 107 can be adapted to the necessary cycles of call/return instructions. For example, if a call/return instruction needs 2 cycles to be executed, the four-state model provides a suitable solution. Even more complicated multi-state models can be used according to the present invention to provide fast context switching.

The two-state model cannot make all calls and returns two-cycle operations, because after two calls in a row, the alternate memory cells of the upper register set hold a full context that has not been written to memory yet. If the next operation is yet another call, four cycles are required to write out the old context, before the memory cells holding it can be made available for the next context. Likewise, after two returns in a row, none of the next return context has been loaded into the alternate memory cells. A third consecutive return will require four cycles to load the return context, over the 128-bit bus. The statistics for three calls or three returns in a row, however, are much better than they are for two calls or two returns, they usually range between zero up to six percent.

Therefore, the four-state model is quite adequate in this embodiment. The reason for the low frequency is fairly easy to understand. In most applications, functions that are not leaf functions typically make multiple calls. It is less common for a function to make exactly one call. In a function making multiple calls, only the first will directly follow another call; the rest will all follow returns. So even for an application that reaches substantial call depths, the statistical frequency of three calls or three returns in a row will tend to be low.

In the four-state model, two bits of internal state function as extended opcode bits, and split the call and return instructions each into four state-dependent variants. However, two of the call variants, and two of the return variants, are degenerate, with other words, they reduce to the same thing. So there are actually three call variants shown in FIG. 4 and labeled $C_1$, $C_2$ and $C_3$ in this state transition diagram and three return variants, labelled $R_1$, $R_2$ and $R_3$. The cycle by cycle operations of these six instruction variants are described in connection with different embodiments for the dual-bit registers below.

Figure 4:
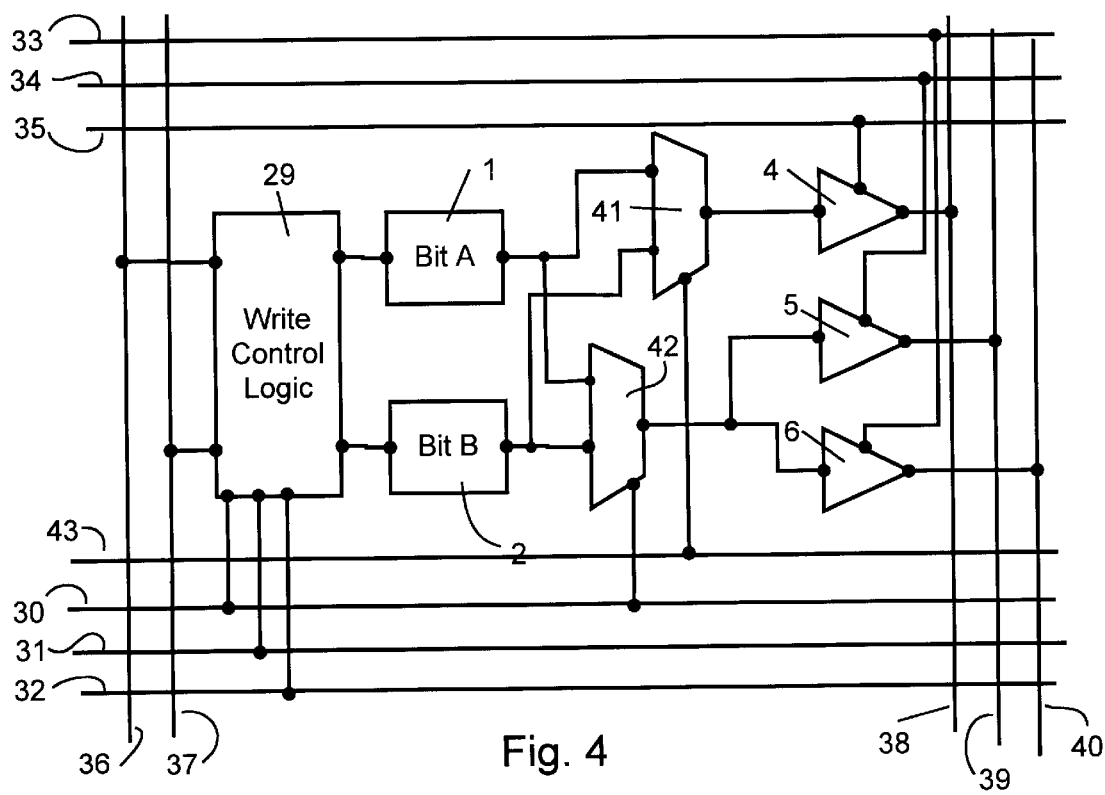
FIG. 4 shows another embodiment of a single register cell in a register file according to the present invention.

FIG. 4 shows a second embodiment of a dual-bit register which can be used with both models. Same elements as in FIG. 1 carry same numerals. The multiplexer 3 of FIG. 1 in this embodiment is replaced by two multiplexors 41 and 42. The inputs of both multiplexors 41 and 42 are coupled with the read ports of the both memory cells 1 and 2. The output of the first multiplexor 41 is connected to the input of driver 4, whereas the output of the second multiplexor is connected to the inputs of drivers 5 and 6. Multiplexor 41 is controlled by a second control line 43 and multiplexor 42 is controlled by control line 30.

This arrangement allows that read port to randomly access either bits of the memory cells 1 or 2, independent of the global control line 30. Thus, it will allow calls to issue in parallel with operations in the integer pipe, and reduce the average cycle time per call by approximately one half cycle.

FIG. 5 shows the four-state model which, for example, can be used with the dual-bit register shown in FIG. 4. The circles indicate the four different stages in which the context switch unit operates. Each letter pair indicates the last two instruction. In other words, CC stands for two calls in a row. It is to understand, that with "calls or returns in a row" or "call/return sequence" is meant throughout in the description two consecutive calls/returns without any return/call but with as many other non-context switching instruction in between. CR stands for a call return sequence, RC for a return call sequence and RR for two consecutive returns. The different transitions from one state to the other are explained below. It is assumed that a upper context consists of registers A10–A15, D8–D15, and two system registers the program status word PSW and a link register PCXI.

$C_1$ indicates a transition caused by a call from the RR- or the CR-state to the RC-state. In the following it is assumed that memory cell 1 is the current memory cell and memory cell 2 the alternate memory cell. Besides setting of program counter, context switch registers which indicate memory locations and other system registers, the respective microinstruction saves basically the content of the memory cells 1 of registers D8, D9, PCXI, and PSW through switch 41 or 42 to the memory. Then line 30 is toggled which connects drivers 5 and 6 with the other memory cell 2. At the same time or in the following the content of current memory cells 1 of register D10, D11, A10, and A11 are saved through switch 41 to the memory. Finally line 43 is toggled, thereby connecting driver 4 with the other memory cell 2. Now memory cell 2 is the current memory cell and memory cell 1 is the alternate memory cell.

$C_2$ indicates a transition caused by a call from the RC-state to the CC-state. In the following it is assumed that memory cell 2 is the current memory cell and memory cell 1 the alternate memory cell. First, line 43 is toggled connecting memory cell 1 with driver 4. The content of memory cells 1 of registers A12, A13, D12 and D13 are saved through switch 41 and driver 4 to the memory. Afterwards or in parallel line 30 is toggled and the content of memory cells 1 of registers A14, A15, D14 and D15 are saved through switch 42. Memory cell 1 is now the current memory cell of all registers and currently stored context has now been saved completely.

$C_3$ indicates a call operation within the CC-state. No transition takes place. In the following it is assumed that memory cell 1 is the current memory cell and memory cell 2 the alternate memory cell. Both memory cells 1 and 2 now carry valid unsaved data. Therefore, to allow a further call the complete context must be saved. First, line 43 is toggled switching memory cell 2 to driver 4. The content of memory cell 2 of registers D8, D9, PCXI, and PSW are saved through switch 41 and driver 4 to the memory. Line 30 is toggled and the content of memory cells 2 of the registers A10, A11, A12, A13, A14, A15, D10, D11, D12, D13, D14, D15 are saved to the memory.

$R_1$ indicates a transition caused by a return from the RC- or the CC-state to the CR-state. In the following it is assumed that memory cell 1 is the current memory cell and memory cell 2 the alternate memory cell. The previously saved content of registers PSW, PCXI, D8, and D9 is loaded from memory 200 through the write control logic 29 to the current memory cells 1 of the respective registers. Then, lines 30 and 43 are toggled switching to memory cells 2 of the respective registers to the write control logic and to the drivers 4, 5, and 6.

$R_2$ indicates a transition caused by a return from the CR-state to the RR-state. In the following it is assumed that memory cell 2 is the current memory cell and memory cell 1 the alternate memory cell. First, lines 30 and 43 are toggled connecting memory cell 1 with drivers 4, 5, and 6. The content of memory cells 1 of registers A12, A13, D12 and D13 are restored through the write control logic 29 from the memory. Memory cell 1 is now the current memory cell of all registers and the previously saved context has now been restored completely.

$R_3$ indicates a return operation within the RR-state. No transition takes place. In the following it is assumed that memory cell 1 is the current memory cell and memory cell 2 the alternate memory cell. Both memory cells 1 and 2 now carry "unvalid" data. Therefore, to allow a further return the complete context must be restored. First, lines 30 and 43 are toggled switching memory cell 2 to the write control logic 29. The content of memory cell 2 of registers A10, A11, A12, A13, A14, A15, D8, D9, D10, D11, D12, D13, D14, D15, PCXI, and PSW are restored through the write control logic 29 from the memory.

Figure 6:
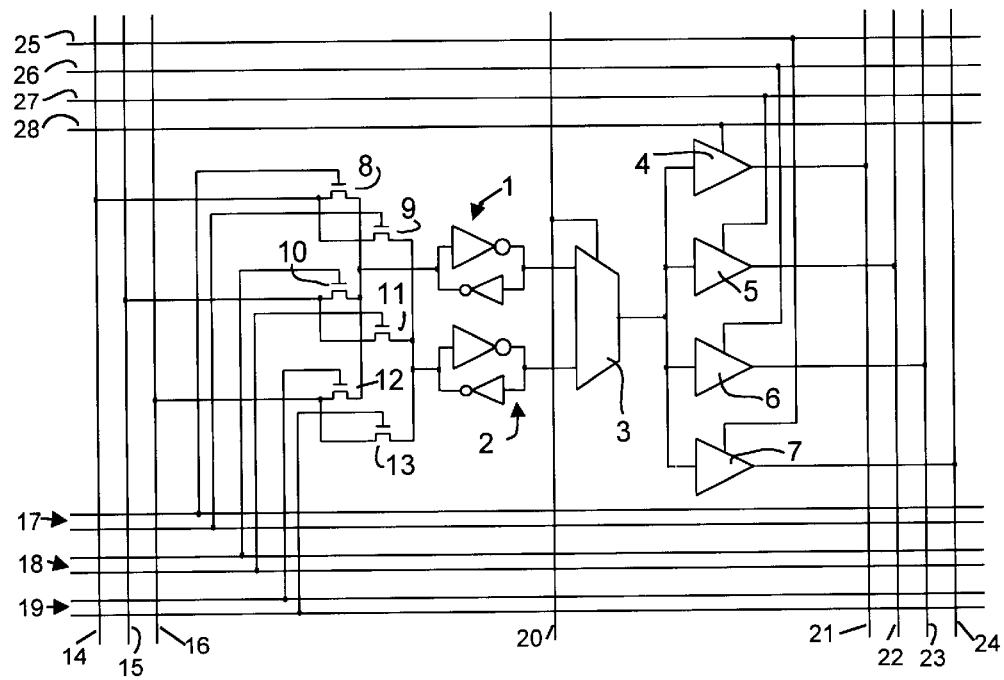
FIG. 6 shows a further embodiment of a single register cell in a register file according to the present invention.

FIG. 6 shows a further embodiment of a dual-bit register according to the invention. Same numerals indicate same elements. Each memory cell 1 and 2 are formed by two inverters. The output of the first inverter forms the read port and is coupled with the input of the second inverter and the output of the second inverter forms the write port and is coupled with the input of the first inverter. This embodiment provides a further driver 7 on the read port side which is coupled with the multiplexer switch 3. The outputs of drivers 4, 5, 6, and 7 are coupled with read port data lines 21, 22, 23, and 24. The control inputs of the drivers 4, 5, 6, and 7 are connected with read port word lines 25, 26, 27, and 28. The write control logic comprises 3 transfer transistor couples. The transistor pairs 8,9; 10,11; 12,13 form an arrangement which allows random access to the two memory cells 1 and 2. Three write port word line couples are connected to the six gates the gates of the transistors 8, . . . 13 to control them individually. Transistor 8 and 9 can couple write port line 14 with the write port of memory cell 1 and memory cell 2, transistors 10 and 11 couple write port line 15 with write port of memory cell 1 and memory cell 2, and transistors 12 and 13 couple write port line 16 with write port of memory cell 1 and memory cell 2. Select line 20 controls multiplexer 3 which connects the inputs of drivers 4, 5, 6, and 7 with either the read port of memory cell 1 or 2.

Figure 7:
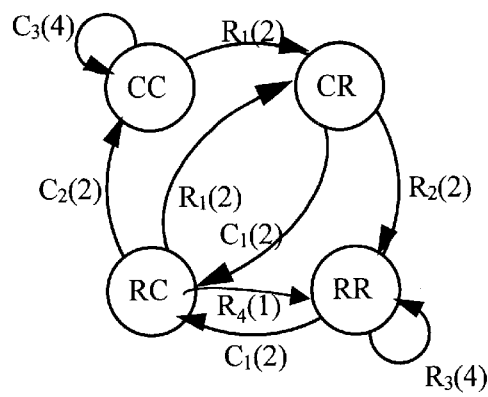
FIG. 7 shows another four state model diagram for a dual bit register cell according to the invention.

FIG. 7 shows the associated four state model. This four state model is in terms of transitions essentially identical with the four state model shown in FIG. 5. In addition, transition $R_4(1)$ is implemented. The steps taken by each transition for the embodiment according to FIG. 6 are slightly different from the ones according to FIG. 4.

Again, $C_1$ indicates a transition caused by a call from the RR- or the CR-state to the RC-state. In the following it is assumed that memory cell 1 is the current memory cell and memory cell 2 the alternate memory cell. Besides setting of program counter, context switch registers which indicate memory locations and other system registers, the respective micro-instruction saves basically the content of the memory cells 1 of registers D8, D9, PCXI, PSW, D10, D11, A10, and A11 through multiplexer switch 3 to the memory. Then line 20 is toggled which connects the drivers 4, 5, 6, and 7 with the other memory cell 2. Now memory cell 2 is the current memory cell and memory cell 1 is the alternate memory cell.

$C_2$ also indicates a transition caused by a call from the RC-state to the CC-state. In the following it is assumed that memory cell 2 is the current memory cell and memory cell 1 the alternate memory cell. First, line 20 is toggled connecting memory cell 1 with drivers 4, 5, 6, and 7. The content of memory cells 1 of registers A12, A13, A14, A15, D12, D13, D14, and D15 are saved through multiplexer switch 3 to the memory. Memory cell 1 is now the current memory cell of all registers and stored context has now been saved completely.

$C_3$ again indicates a call operation within the CC-state. No transition takes place. In the following it is assumed that memory cell 1 is the current memory cell and memory cell 2 the alternate memory cell. Both memory cells 1 and 2 now carry valid unsaved data. Therefore, to allow a further call the complete context must be saved. First, line 20 is toggled switching memory cell 2 to drivers 4, 5, 6, and 7. The content of memory cell 2 of registers D8, D9, PCXI, PSW, A10, A11, A12, A13, A14, A15, D10, D1, D12, D13, D14, and D15 are saved through multiplexer switch 3 to the memory.

$R_1$ indicates a transition caused by a return from the RC- or the CC-state to the CR-state. In the following it is assumed that memory cell 1 is the current memory cell and memory cell 2 the alternate memory cell. The previously saved content of registers PSW, PCXI, D8, and D9 is loaded from memory 200 through one of the transfer transistors 8, 10, or 12 to the current memory cells 1 of the respective registers. Then, lines 20 is toggled switching the output to memory cells 2 of the respective registers.

Also, $R_2$ indicates a transition caused by a return from the CR-state to the RR-state. In the following it is assumed that memory cell 2 is the current memory cell and memory cell 1 the alternate memory cell. First, line 20 is toggled connecting memory cell 1 with the output drivers 4, 5, 6 and 7. The content of memory cells 1 of registers A12, A13, D12, D13, A14, A15, D14, and D15 are restored through one of the transfer transistors 8,10, or 12 from the memory. Memory cell 1 is now the current memory cell of all registers and the previously saved context has now been restored completely.

$R_3$ indicates a return operation within the RR-state. Again, no transition takes place. In the following it is assumed that memory cell 1 is the current memory cell and memory cell 2 the alternate memory cell. Both memory cells 1 and 2 now carry "unvalid" data. Therefore, to allow a further return the complete context must be restored. First, line 20 is toggled thereby switching memory cell 2 to the output drivers 4, 5, 6, and 7. The content of memory cell 2 of registers A10, A11, A12, A13, A14, A15, D8, D9, D10, D11, D12, D13, D14, D15, PCXI, and PSW are restored through the transfer transistors 9, 11, or 13 from the memory.

The $R_4$ transition indicates a transition caused by a return from the RC-state wherein the return context is the base of a call chain. For this transition, it is not relevant which memory cell is the current one as no transfers from memory to the memory cells takes place. Only, line 20 is toggled to switch to the other memory cell.

The embodiment according to FIG. 6 uses separate word lines 17, 18, and 19 to select which bit is written from the write ports. Even though it involves two more control lines running across the cell, this design is still smaller, faster, and more reliable than it would be with only three write port word lines and the steering logic to control which memory cell is written. With separate word lines 17, 18, and 19, a single n-transistor can be used for gating between the write data line and the selected memory cell. If the storage memory cell were selected downstream of the write port word selection, each memory cell would need to be fronted by a transmission gate; that could cause charge sharing problems and clock transition timing sensitivities. A local inverter would be needed to provide the signal on line 20 to the transmission gate.

The random write addressability of the bit cells in this design provides a convenient solution, because the number of cycles in the R1 sequence before the next instruction could be dispatched. In the R1 sequence, no new instruction can issue until the line 20 is toggled, permitting decode-cycle reading of registers in the return context. In this embodiment reading and writing is independent, therefore the timing for toggling line 20 during a write sequence is not critical. In this embodiment the control line 20 can be toggled early, to allow issuing of the next instruction, while the preloading of the next context continues, using the random addressing capability on the write ports.

Figure 8:
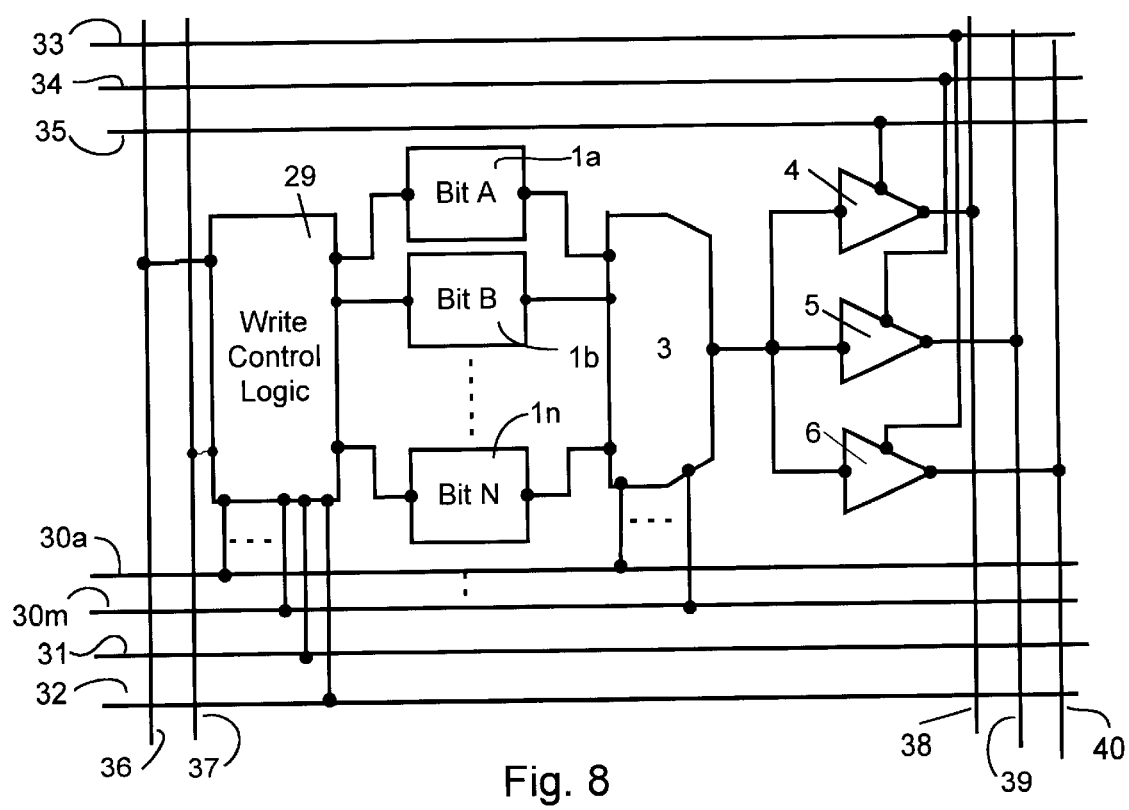
FIG. 8 shows a third embodiment of a single register with multiple cells according to the invention.

FIG. 8 shows a single register having a plurality of memory cells 1a, 1b, . . . 1n. This embodiment provides a write control logic 29 and a multiplexer switch 3 which are controlled by a plurality of control lines 30a, . . . 30m, wherein the number of control lines>=ld(number of memory cells). With each call a context switch control unit switches to the next available memory cell. Only in the case when no further memory cell is available, for example a switch from memory cell 1n to memory cell 1a, the content of the next memory cell must be saved to the memory before the new memory cell can be used. This could be easily done, for example by means of a trap or by means of one of the above described methods. Such an arrangement provides, depending on the number of memory cells, the fastest way to switch between different contexts without involving any or only a minimum of transfers between the register file and the memory.

If different tasks each have a context which includes different registers and therefore has a different size a special function register may be provided which indicates which register of the register files 104 and 105 have to be saved. As both register files 104 and 105 altogether contain 32 registers, a special 32-bit register in the system register file 106 could indicate by means of each bit which register is assigned to the respective context. The lower bits 0 to 15 could indicate the data registers and the upper bits 16 to 31 the address registers. Such a register in the system register file is also preferably a multi-bit register according to the present invention and part of the respective contexts. Although, such a concept offers very flexible mechanism it also needs a more complex control mechanism to handle the different registers. This concept offers, for example, the ability to assign no register to a specific context which needs no general purpose registers which can speed up the respective context switching routine under all circumstances.

Another embodiment using such a register in the system register file can use a fixed number of registers which are assigned to each task similar to the concept described above. For example, 16 register could be used to define a context. By means of the special register it is not necessary to use the same 16 registers for each context. The user could select 16 out of the 32 registers and assign them by means of the special register in the system register file.

What is claimed is:

1. Method of context switching from a first task to a second task in a data processing unit having a memory and a plurality of registers coupled with said memory with a set of registers representing a context, each of said registers having at least two memory cells and a selector to switch between said memory cells, the method comprises:

upon execution of a first predetermined event the step of speculatively storing a less than full portion of a current context from said set of registers to said memory and then switching to the next available memory cell in each of said registers, and upon execution of a second predetermined event the step of switching back to the previous memory cell in each of said registers.

2. Method as in claim 1, wherein after execution of n−1 first events, whereby n is equal the number of memory cells in a register, and upon execution of a further first event after switching to another memory cell the step of storing the content of said memory cells of all registers of said set of registers in said memory.

3. Method as in claim 2, wherein after execution of n first events, whereby n is equal the number of memory cells in a register, and upon execution of a further first event after switching to another memory cell the step of storing the content of said memory cells of all registers of said set of registers in said memory.

4. Method as in claim 2, wherein after execution of n−1 second events, whereby n is equal the number of memory cells in a register, and upon execution of a further second event after switching to another memory cell the step of loading the content of the stored memory cells of all registers of said set of registers from said memory into said registers.

5. Method as in claim 3, wherein after execution of n second events, whereby n is equal the number of memory cells in a register, and upon execution of a further second event after switching to another memory cell the step of loading the content of the stored memory cells of all registers of said set of registers from said memory into said registers.

6. Method as in claim 1, wherein said first predetermined event is a subroutine call or interrupt, and said second predetermined event is a return from a subroutine or interrupt.

7. Method as in claim 1, wherein:

said set of registers can simultaneously hold n contexts, said data processing unit requires a number p of cycles to transfer said context from said plurality of registers to said memory, and context changes that are respectively in response to each of n executions of first predetermined events without any intervening second predetermined event are guaranteed to take less than p cycles each.

8. Method as in claim 7, wherein said data processing unit requires a number q of cycles to load a context from said memory into said plurality of registers, and the method further comprises speculatively loading a context into said plurality of registers from said memory in response to said second predetermined event, wherein two context changes that are respectively in response to two executions of second predetermined events without any intervening first predetermined event are guaranteed to take less than q cycles each.

9. Method as in claim 8, wherein q equals p.

10. Method as in claim 1, wherein n is at least three.

11. Method of context switching from a first task to a second task in a data processing unit having a memory and a plurality of registers coupled with said memory with a set of registers representing a context, each of said registers having at least two memory cells and a selector to switch between said memory cells, the method comprises:

upon execution of a first predetermined event the step of switching to the next available memory cell in each of said registers, upon execution of a second predetermined event the step of switching back to the previous memory cell of said registers, and upon execution of said first predetermined event and before switching to another memory cell the step of storing the content of the current memory cells of a predefined number of registers of said set of registers in said memory.

12. Method as in claim 11, wherein upon execution of said first predetermined event and after switching to another memory cell the step of storing the content of the current memory cells of the remaining number of registers of said set of registers in said memory.

13. Method as in claim 11, wherein upon execution of said second predetermined event and before switching to another memory cell the step of loading the content of the stored memory cells of a predefined number of registers of said set of registers from said memory into said registers.

14. Method as in claim 13, herein upon execution of said second predetermined event and after switching to another memory cell the step of loading the content of the stored memory cells of the remaining number of registers of said set of registers from said memory into said registers.

15. Method of context switching from a first task to a second task in a data processing unit having a memory and registers coupled with said memory with a set of registers representing a context, each of said registers having at least two memory cells, each memory cell having at least one read port and one write port and a switch to select one of said read ports and a switch for random access of said write ports, the method comprises:
    upon execution of a first predetermined event the step of speculatively loading at least a portion of a context into said plurality of registers from said memory and then switching to the read ports of the next available memory cell in each of said registers, and
    upon execution of a second predetermined event the step of switching back to the read ports of the previous memory cell in each of said registers.

16. Method as in claim 15, wherein after execution of n−1 first events whereby n is equal the number of memory cells in a register, and upon execution of a further first event after switching to the read port of another memory cell the step of storing the content of the current memory cells of all registers of said sets of registers in said memory.

17. Method as in claim 15, wherein after execution of n first events, whereby n is equal the number of memory cells in a register, and upon execution of a further first event after switching to the read port of another memory cell the step of storing the content of the current memory cells of all registers of said set of registers in said memory.

18. Method as in claim 16, wherein after execution of n−1 second events, whereby n is equal the number of memory cells in a register, and upon execution of a further second event the step of loading the content of the stored memory cells of all registers of said set of registers from said memory through said write port into said registers.

19. Method as in claim 17, wherein after execution of n second events, whereby n is equal the number of memory cells in a register, and upon execution of a further second event the step of loading the content of the stored memory cells of all registers of said set of registers from said memory through said write port into said registers.

20. Method as is claim 15, wherein a register indicates which registers are assigned to a set of registers.

21. Method of context switching from a first task to a second task in a data processing unit having a memory and registers coupled with said memory with a set of registers representing a context, each of said registers having at least two memory cells, each memory cell having at least one read port and one write port and a switch to select one of said read ports and a switch for random access of said write ports, the method comprises:
    upon execution of a first predetermined event the step of switching to the read ports of the next available memory cell in each of said registers,
    upon execution of a second predetermined event the step of switching back to the read ports of the previous memory cell in each of said registers, and
    upon execution of said first predetermined event and before switching to the read port of another memory cell the step of storing the content of the current memory cells of a predefined number of registers of said set of registers in said memory.

22. Method as in claim 21, wherein upon execution of said first predetermined event and after switching to the read port of another memory cell the step of storing the content of the current memory cells of the remaining number of registers of said set of registers in said memory.

23. Method as in claim 21, wherein upon execution of said second predetermined event the step of loading the content of the stored memory cells of a predefined number of registers of said set of registers from said memory through said write port into said registers.

24. Method as in claim 22, wherein upon execution of said second predetermined event the step of loading the content of the stored memory cells of the remaining number of registers of said set of registers from said memory through said write port into said registers.

25. Data processing unit, comprising:
    at least one register having at least one read port and one write port, said register having at least two memory cells each having a write line and a read line,
    a first switch comprising inputs and one output for coupling said read line of one of said memory cells with said read port,
    a second switch having at least one input and outputs for coupling said write line of one of said memory cells with said write port, and
    a control unit configured to operate at least said first and second switches to, in response to a call instruction, speculatively initiate saving of content of current memory cells and select a next one of said at least two memory cells as the new current memory cell, wherein the new current memory cell is made available for use only after some content of the previous memory cells has been speculatively saved, and to, in response to a return event, select the previous memory cell as once again the current memory cell.

26. Data processing unit as in claim 25, further comprising multiple read port drivers having an input and an output, and a plurality of read port data lines, whereby said inputs of said read port drivers being connected to said output of said switch, and said outputs of said read port drivers being connected to said output of said switch, and said outputs of said read port drivers being connected to said read port data lines.

27. Data processing unit as in claim 25, further comprising a plurality of write port data lines wherein said second switch can couple each write port data line with said write line of each memory cell.

28. Data processing unit as in claim 25, wherein said second switch provides random access to each memory cell.

29. Data processing unit as in claim 28, wherein said second switch comprises a plurality of transfer transistors to couple each write line of each memory cell with one of said write ports.

30. Data processing unit as in claim 25, further comprising a control unit for storing and loading the content of said register.

31. Data processing unit as in claim 30, wherein said control unit comprises a state machine.

32. Data processing unit as in claim 25, wherein each of said at least two memory cells corresponds to a context, and said first and second switches are configured to permit issuing of a next instruction during preloading of a next context.

33. Data processing unit comprising:
- a register file having a first set of registers and a second set of registers, said registers in said first set of registers having at least one read port and one write port and said registers each having n memory cells each having a write line and a read line, wherein n is at least two,
- a first switch for coupling a read line of one of said memory cells of each register of said first register set with a respective read port, and
- a second switch for coupling a write line of one of said memory cells of each register of said first register set with a respective write port, and
- a memory,
- a bus that couples said first set of registers with said memory, wherein the bus is configured to transfer a context from said first set of registers to said memory in p cycles, and
- a control unit that controls said switches to conduct context switching, including speculatively saving contexts to memory that may not ultimately need to be saved to memory so that even if n calls are executed without intervening returns, the calls are guaranteed to take less than p cycles each.

34. Data processing unit as in claim 33, wherein said registers each comprise multiple read and multiple write ports and said first and said second switch couples said multiple read and write ports with the respective memory cells of each register of said first register set.

35. Data processing unit as in claim 33, wherein said control unit comprises a state machine.

36. Data processing unit as in claim 33, wherein said first set of registers comprises data and address registers.

37. Data processing unit as in claim 33, further comprising a third switch for coupling a read line of one of said memory cells of each register of said first register set with a read port of each register, wherein said first and third switches are controlled to permit independent reading of a first and a second memory cell, respectively, of said each register.

38. Data processing unit as in claim 33, wherein two of said memory cells of each register respectively correspond to two contexts, and said registers and first and third switches are configured to permit a call to issue in parallel with an integer operation.

* * * * *